(12) United States Patent
Chang

(10) Patent No.: US 7,804,086 B2
(45) Date of Patent: Sep. 28, 2010

(54) PHASE CHANGE MEMORY DEVICE HAVING DECREASED CONTACT RESISTANCE OF HEATER AND METHOD FOR MANUFACTURING THE SAME

(75) Inventor: Heon Yong Chang, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 283 days.

(21) Appl. No.: 12/173,506

(22) Filed: Jul. 15, 2008

(65) Prior Publication Data
US 2009/0302300 A1    Dec. 10, 2009

(30) Foreign Application Priority Data
Jun. 5, 2008   (KR) ............... 10-2008-0052889

(51) Int. Cl.
*H01L 47/00* (2006.01)
(52) U.S. Cl. ............ 257/4; 257/2; 257/3; 257/42; 257/E45.002; 438/102; 365/148; 365/163
(58) Field of Classification Search .......... 257/4, 257/2, 3, 42, E45.002; 438/102; 365/148, 365/163
See application file for complete search history.

(56) References Cited
U.S. PATENT DOCUMENTS
7,667,219 B2 *   2/2010   Chang et al. .............. 257/4

FOREIGN PATENT DOCUMENTS
KR   1020080028657 A   4/2008
KR   1020080039701 A   5/2008

* cited by examiner

*Primary Examiner*—Tu-Tu V Ho
(74) *Attorney, Agent, or Firm*—Ladas & Parry LLP (57) ABSTRACT

A phase change memory device includes a silicon substrate having cell and peripheral regions. A first insulation layer with a plurality of holes is formed in the cell region. Recessed cell switching elements are formed in the holes. Heat sinks are formed in the holes in which the cell switching elements are formed, and the heat sinks project out of the first insulation layer. A gate is formed in the peripheral region and has a stack structure of a gate insulation layer, a first gate conductive layer, a second gate conductive layer, and a hard mask layer. A second insulation layer is formed on the surface of the silicon substrate. The second insulation layer has contact holes exposing the heat sinks. Heaters are formed in the contact holes, and stack patterns of a phase change layer and a top electrode are formed on the heaters.

39 Claims, 7 Drawing Sheets

PHASE CHANGE MEMORY DEVICE HAVING DECREASED CONTACT RESISTANCE OF HEATER AND METHOD FOR MANUFACTURING THE SAME

CROSS-REFERENCE TO RELATED APPLICATIONS

The present application claims priority to Korean patent application number 10-2008-0052889 filed on Jun. 5, 2008, which is incorporated herein by reference in its entirety.

BACKGROUND OF THE INVENTION

The present invention relates generally to a phase change memory device and a method for manufacturing the same, and more particularly, to a phase change memory device in which the contact resistance of heaters is decreased and the amorphous phase of a phase change layer can occur in a stable manner and a method for manufacturing the same.

Memory devices are typically grouped into volatile random access memory (RAM) in which data is lost when power is interrupted, and non-volatile read-only memory (ROM) in which stored data is maintained even when power is interrupted. Examples of volatile RAM include dynamic RAM (DRAM) and static RAM (SRAM), and examples of non-volatile ROM include flash memory devices such as electrically erasable and programmable ROM (EEPROM).

DRAM is considered an excellent memory device and has many desirable characteristics. However, DRAM must have high charge storing capacity. In order to obtain a high charge storing capacity, the surface area of certain electrodes in the DRAM must be increased; however, if the surface area of the electrodes is increased it is difficult to achieve a high level of integration. Further, in a flash memory device two gates are stacked on each other, and thus a high operation voltage relative to a power supply voltage is required. Therefore, a separate booster circuit is necessary in order to generate the voltage necessary for write and delete operations, which in turn makes it difficult to achieve a high level of integration.

With these constraints in mind, efforts have been made to develop a memory device having a simple configuration and capable of accomplishing a high level of integration while retaining the desirable characteristics of a non-volatile memory device. Recently, phase change memory devices have been gaining popularity. In the phase change memory device, a phase change (crystalline state to amorphous state) occurs in a phase change layer interposed between a bottom electrode and a top electrode when a current flow is applied to and flows between the bottom electrode and the top electrode. The amorphous and crystalline states have different resistances, and using this phenomenon information stored in a cell can be recognized using the medium of the resistances of the crystalline state and the amorphous state.

An extremely important factor that must be considered when developing a phase change memory device is the reduction of programming current. In order to reduce programming current, the cell switching elements of phase change memory devices are configured using vertical PN diodes in place of NMOS transistors. The vertical PN diodes have increased current flow when compared to the NMOS transistors, and therefore programming current can be reduced and the size of cells can be decreased. As such, the vertical PN diodes can be advantageously applied to allow for higher integration in a phase change memory device.

In the phase change memory device, a phase change occurs at the interface between a heater and a phase change layer. Therefore, in order to reduce programming current, the area of the interface must be decreased. To this end, it is necessary to decrease the size of the heater.

In the phase change memory device, when reset programming is implemented (that is, when the phase change layer is quenched after being melted), heat transfer occurs toward the area of the heater. It is therefore necessary to quickly decrease the temperature of the heater so that the change into the amorphous phase is stable and a reset state having high resistance can be easily formed. In order to reduce programming current, it is advantageous to decrease the size of the heater. However, if the size of the heater is decreased, heat cannot be quickly transferred to the heater, and the reset state having high resistance cannot be easily formed. Typically, a heater is formed to have a small width in the range of 10~20 nm and a relatively substantial height of 100 nm.

In this situation, the aspect ratio (which is in the range of 5~10) is substantial, and a problem is caused in that the size of the lower end of a contact hole (in which the heater is to be formed) decreases. As the contact size of the lower end of the heater decreases, the contact resistance increases. Thus, even when the current flow through the cell switching element is increased, the contact resistance between the heater and the cell switching element increases, and thus current flow through the heater decreases.

Heat transfer does not occur quickly when the phase change layer is quenched, and therefore when the height of the heater is decreased the phase change layer may be placed under a partial crystalline state rather than a complete amorphous state so that the reset state having high resistance cannot be formed easily. Conversely, when the height of the heater is increased, the contact resistance at the lower end of the heater increases such that the contact resistance is greater than the set resistance in the crystalline state of the phase change layer.

SUMMARY OF THE INVENTION

Embodiments of the present invention are directed to a phase change memory device in which the contact resistance of heaters is decreased and the amorphous phase of a phase change layer can be occur in a stable manner, and a method for manufacturing the same.

Additionally, embodiments of the present invention are directed to a phase change memory device in which the programming current is reduced, and a method for manufacturing the same.

In one embodiment, a phase change memory device comprises a silicon substrate having a cell region and a peripheral region; a first insulation layer formed in the cell region of the silicon substrate and having a plurality of holes; recessed cell switching elements formed in the holes; heat sinks formed in the holes in which the cell switching elements are formed, the heat sinks projecting out of the first insulation layer; a gate formed in the peripheral region of the silicon substrate and having a stack structure of a gate insulation layer, a first gate conductive layer, a second gate conductive layer, and a hard mask layer; a second insulation layer formed on the entire surface of the silicon substrate having the heat sinks and the gate formed thereon, the second insulation layer having contact holes for exposing the heat sinks and the second insulation layer exposing the hard mask layer of the gate; heaters formed in the contact holes; and stack patterns of a phase change layer and a top electrode formed on the heaters.

The phase change memory device further comprises an N+ base layer formed in a surface of the silicon substrate in the cell region.

The cell switching elements are recessed from upper ends of the holes to a depth in the range of 100~500 Å.

The cell switching elements comprise vertical PN diodes in which an N-type silicon layer and a P-type silicon layer are stacked.

The N-type silicon layer has a doping concentration of in the range of $1\times10^{18}$~$1\times10^{20}$ ions/cm$^3$.

The P-type silicon layer has a doping concentration of in the range of $1\times10^{20}$~$1\times10^{22}$ ions/cm$^3$.

The heat sinks comprise any one a W layer, a Cu layer, an Al layer, and a WSi layer.

The first gate conductive layer comprises a polysilicon layer.

The first gate conductive layer has the same height as the first insulation layer when viewed from the cross-section.

The second gate conductive layer comprises any one of a W layer, a Cu layer, an Al layer, and a WSi layer, in the same manner as the heat sinks.

The heaters comprise any one of a TiW layer, a TiAlN layer, and a TiN layer.

The heaters have a height in the range of 20~80 nm.

The phase change memory device further comprises a hard mask layer formed between sidewalls of the holes and the heaters.

The hard mask layer comprises a layer having the same level as the hard mask layer of the gate.

The hard mask layer comprises a nitride layer.

The phase change memory device further comprises a passivation layer formed on the second insulation layer.

The passivation layer comprises a nitride layer.

The phase change layer is formed of a material containing at least one of Ge, Sb, and Te.

The phase change layer is doped with at least one of oxygen, nitrogen and silicon.

The top electrodes are formed using any one of TiW, TiAlN, TiN and WN.

In another aspect, a method for manufacturing a phase change memory device comprises the steps of forming a first insulation layer having a plurality of holes in a cell region of a silicon substrate which has the cell region and a peripheral region; forming sequentially a gate insulation layer and a first gate conductive layer in the peripheral region of the silicon substrate to have the same height as the first insulation layer; forming recessed cell switching elements in the respective holes; forming sequentially a second gate conductive layer and a hard mask layer on the first insulation layer including the holes in which the cell switching elements are formed and the first gate conductive layer; etching the hard mask layer, the second gate conductive layer, the first gate conductive layer, and the gate insulation layer which are formed in the peripheral region, and thereby forming a gate; etching the hard mask layer and the second gate conductive layer in the cell region, and thereby forming heat sinks comprising the second gate conductive layer on the cell switching elements; forming a second insulation layer on the first insulation layer and the silicon substrate of the peripheral region to expose the hard mask layer on the heat sinks and the hard mask layer of the gate; etching the hard mask layer of the cell region and defining contact holes to expose the heat sinks; forming heaters in the contact holes; and forming stack patterns of a phase change layer and a top electrode on the second insulation layer including the heaters.

Before the step of forming the first insulation layer, the method further comprises the step of forming an N+ base layer in a surface of the silicon substrate in the cell region.

The cell switching elements are formed to be recessed to a depth in the range of 100~500 nm from upper ends of the holes.

The cell switching elements comprise vertical PN diodes.

The step of forming the cell switching elements comprises the steps of forming an N-type silicon layer in the holes; recessing the N-type silicon layer; and ion-implanting P-type impurities onto the recessed N-type silicon layer, and thereby forming a P-type silicon layer.

The step of forming the N-type silicon layer is implemented through a selective epitaxial growth process.

The N-type silicon layer is formed by ion-implanting P or As ions to have a doping concentration in the range of $1\times10^{18}$~$1\times10^{20}$ ions/cm$^3$.

The P-type silicon layer is formed by ion-implanting B or $BF_2$ ions to have a doping concentration in the range of $1\times10^{20}$~$1\times10^{22}$ ions/cm$^3$.

The first gate conductive layer comprises a polysilicon layer.

The second gate conductive layer and the heat sinks comprise at least one of a W layer, a Cu layer, an Al layer, and a WSi layer.

The hard mask layer comprises a nitride layer.

The contact holes are defined to have a depth in the range of 20~80 nm.

The heaters comprise any one of a TiW layer, a TiAlN layer, and a TiN layer.

The heaters are formed to have a height in the range of 20~80 nm.

After the step of forming the heaters and before the step of the stack patterns of the phase change layer and the top electrode, the method further comprises the step of forming a passivation layer on the second insulation layer.

The passivation layer comprises a nitride layer.

The phase change layer is formed a material containing at least one of Ge, Sb, and Te.

The phase change layer is doped with at least one of oxygen, nitrogen, and silicon.

The top electrodes are formed using any one of TiW, TiAlN, TiN and WN.

DESCRIPTION OF SPECIFIC EMBODIMENTS

In embodiments of the present invention, the height of heaters is decreased to a height that is lower than that of conventional heaters, and heat sinks are formed under the heaters having the decreased height. In the present invention, the heat sinks are formed using the same material as a gate formed in a peripheral region. Accordingly, in the present invention, it is not necessary to conduct a separate process when forming the heat sinks.

In the present invention having the heaters with a reduced height, the heater forming process can be conducted easily, and the contact resistance of the heaters can be decreased. As a result, current flow can be increased. More specifically, in embodiments of the present invention the area of the interface between the heater and the phase change layer can be decreased, and therefore programming current can be reduced.

Further, most heat transfer occurs toward the areas of the heaters when the phase change layer is quenched. In embodiments of the present invention, the heat sinks (which have high heat conductivity) are formed under the heaters, and therefore heat transfer to the areas of the heaters can occur quickly due to the presence of the heat sinks. Accordingly, the amorphous phase of the phase change layer can occur in a stable manner.

Finally, in the present invention, when the height of the heat sinks is increased, the heat transfer can occur even quicker allowing for an improvement in the operational characteristics of a phase change memory device.

Hereafter, specific embodiments of the present invention will be described in detail with reference to the attached drawings.

Figure 1:
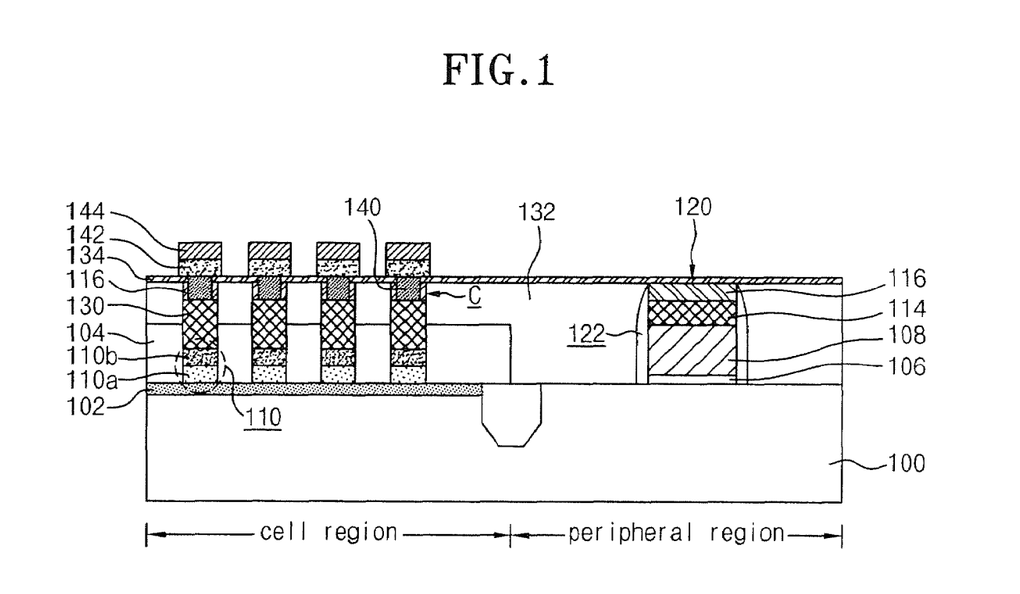
FIG. 1 is a cross-sectional view showing a phase change memory device according to an embodiment of the present invention.

FIG. 1 is a cross-sectional view showing a phase change memory device according to an embodiment of the present invention.

Referring to FIG. 1, a silicon substrate 100, which is divided into a cell region and a peripheral region, is prepared. An N+ base layer 102 is formed in a portion of the surface of the silicon substrate 100 located in the cell region. The N+ base layer 102 electrically connects vertical PN diodes 110 (which serve as cell switching elements) to a word line. A first insulation layer 104 is formed on the portion of the silicon substrate 100 (which includes the N+ base layer 102) in the cell region. A plurality of holes H are defined in the first insulation layer 104. The holes H are defined in areas corresponding to respective phase change cell areas.

The vertical PN diodes 110 are formed in the respective holes H to have a height that does not completely fill the holes H, and the vertical PN diodes 110 are composed of a stack of an N-type silicon layer 110a and a P-type silicon layer 110b. Heat sinks 130 are formed on the vertical PN diodes 110 in the respective holes H in such a way as to project out of the first insulation layer 104. The heat sinks 130 are formed of a metallic material having excellent heat conductivity, for example, any one of W, Cu, and Al.

A transistor including a gate 120 and junction areas (not shown) is formed on the silicon substrate 100 in the peripheral region. The transistor is used as a driving circuit. The gate 120 includes a gate insulation layer 106, a first gate conductive layer 108 (formed of, e.g., polysilicon), a second gate conductive layer 114, and a hard mask layer 116 comprising a nitride layer. Here, when viewed from its cross-section, the first gate conductive layer 108 has the same height as the first insulation layer 104 of the cell region (i.e., the upper surface of the first gate conductive layer 108 is coplanar to the upper surface of the first insulation layer 104). Also, the second gate conductive layer 114 is formed to have the same level as the heat sinks 120 of the cell region (i.e., the upper surface of the second gate conductive layer 114 is coplanar to the upper surface of the heat sinks 120 of the cell region). Gate spacers 122 are formed on both sidewalls of the gate 120.

A second insulation layer 132 is formed on the entire surface of the silicon substrate 100 including the cell region in which the heat sinks 130 are formed and the peripheral region in which the gate 120 is formed. Contact holes C are formed in the second insulation layer to expose the heat sinks 130 of the cell region. The hard mask layer 116 of the peripheral region remains exposed after the formation of the second insulation layer 132. A hard mask layer 116 having the same level as the hard mask layer 116 of the gate 120 is formed on the sidewalls of the contact holes C. A passivation layer 134 is formed on the second insulation layer 132, and heaters 140 are formed to fill the contact holes C. The heaters 140 according to an embodiment of the present invention have a height less than that of the conventional heaters (for example, a height less than 100 nm, and preferably, a height in the range of 20~80 nm).

A stack pattern of a phase change layer 142 and a top electrode 144 are formed each of the heaters and portion of passivation layer 134 corresponding to the heaters 140. The stack patterns of the phase change layer 142 and the top electrode 144 have the shape of a line extending in a direction perpendicular to the N+ base layer 102.

Although not shown illustrated in the drawing, a third insulation layer is formed on the second insulation layer 132 (which includes the stack patterns of the phase change layer 142 and the top electrode 144), and bit lines are formed such that they connect to the top electrodes 144 via top electrode contacts. A fourth insulation layer is formed on the third insulation layer to cover the bit lines, and a word line is formed on the fourth insulation layer and is electrically connected to the N+ base layer 102 via contacts.

In the phase change memory device according to the present embodiment, the heat sinks are formed under the heaters, and therefore when the phase change layer is quenched heat transfer can quickly occur at the areas of the heaters. Accordingly, the amorphous phase of the phase change layer can occur in a stable manner.

Additionally, relative to conventional heaters, the height of the heaters can be decreased and the depth of the contact holes in which the heaters are to be formed can also be decreased. Therefore, it is possible to prevent the size of the lower ends of the heaters from decreasing. As a result, increases in contact resistance can be prevented, and current flow from the cell switching elements, through the heaters, and to the phase change layer can be increased.

In addition, because of the height decrease of the heaters, the area of the interface between the heater and the phase change layer can be further decreased allowing programming current can be reduced.

Accordingly, in the phase change memory device according to an embodiment of the present invention, the amorphous phase of the phase change layer can occur in a stable manner, the current flow from the cell switching elements to the phase change layer can be increased, and the contact resistance of the heaters can be decreased, whereby the characteristics and the reliability of the phase change memory device can be improved.

FIGS. 2A through 2J are cross-sectional views shown for illustrating the process steps in a method for manufacturing a phase change memory device according to another embodiment of the present invention. The method will be described below.

Figure 2A:
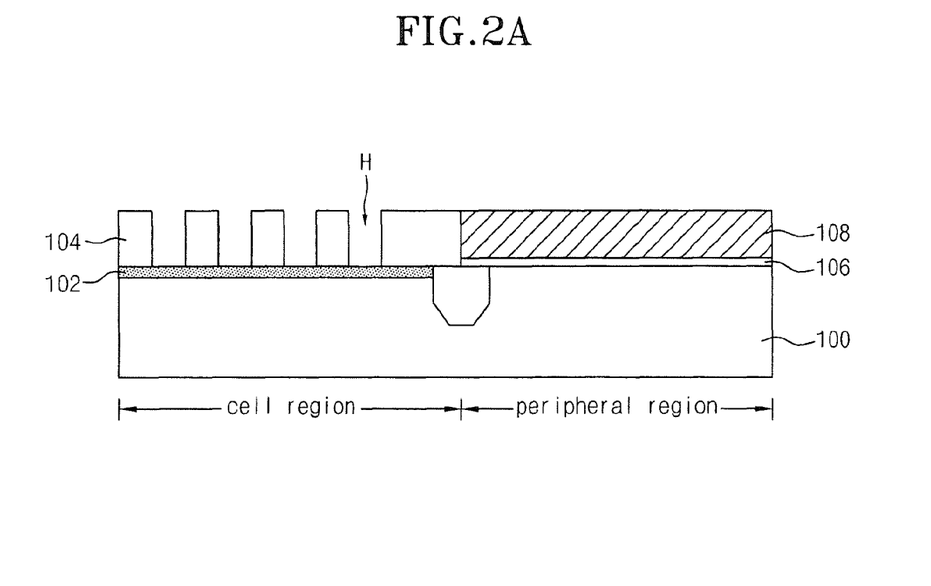
FIGS. 2A through 2J are cross-sectional views shown for illustrating the process steps in a method for manufacturing a phase change memory device according to another embodiment of the present invention.

Referring to FIG. 2A, a silicon substrate 100 having a cell region and a peripheral region is prepared. Active regions are defined in the respective regions, and then an N+ base layer 102 is formed by ion-implanting N-type impurities in the surface of the active region in the cell region. Then, a first insulation layer 104 is formed on the entire surface of the silicon substrate 100 including the N+ base layer 102, and the portion of the first insulation layer 104 formed in the peripheral region is removed.

A gate insulation layer 106 is formed using, for example, a thermal oxidation process, in the peripheral region of the silicon substrate 100 exposed by the removal of the portion of the first insulation layer 104. A first gate conductive layer 108 made of polysilicon is then deposited on the gate insulation layer 106 and the first insulation layer 104. The first gate conductive layer 108 is polished using a chemical mechanical polishing (CMP) process such that the first insulation layer 104 of the cell region is exposed.

The first insulation layer 104 formed in the cell region is then etched to define a plurality of holes H. Here, the respective holes H are defined at positions corresponding to respective phase change cell areas in the cell region.

Figure 2B:
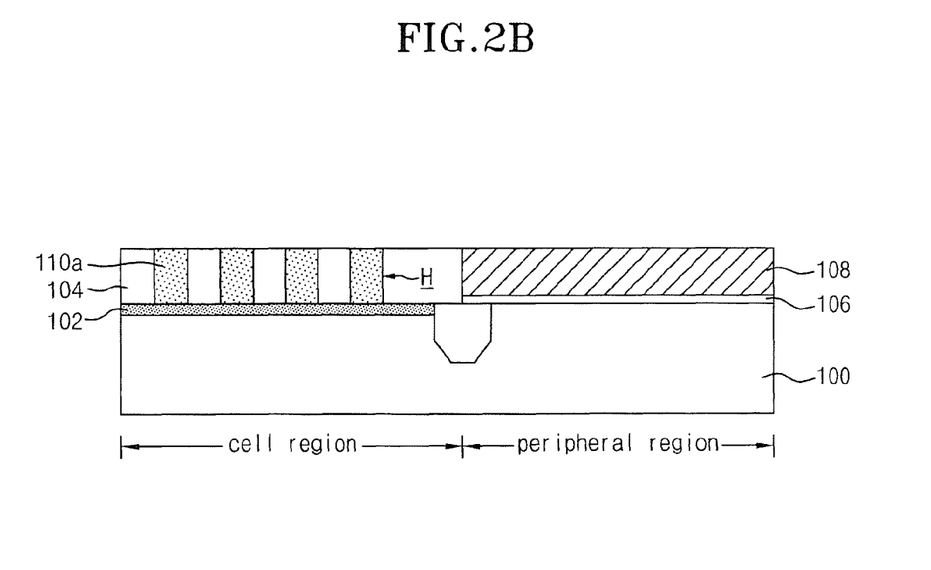

Referring to FIG. 2B, an N-type silicon layer 110a is grown in the holes H using a selective epitaxial growth (SEG) process, and then the N-type silicon layer 110a (which has grown up to the upper end of the first insulation layer 104) is polished using a CMP process. The N-type silicon layer 110a is formed using P or As and has a doping concentration in the range of $1\times10^{18}$~$1\times10^{20}$ ions/cm$^3$.

Figure 2C:
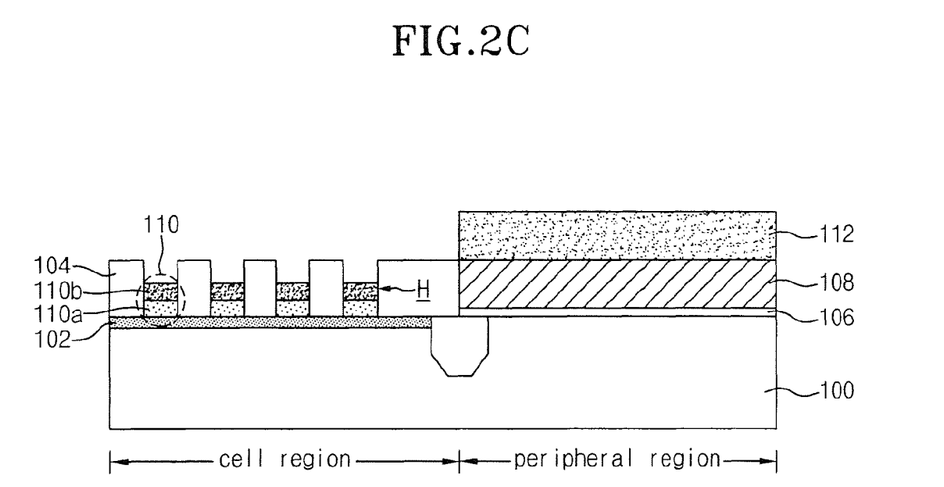

Referring to FIG. 2C, a first etch mask 112 comprising, for example, a photoresist pattern, is formed on the first gate conductive layer 108 in the peripheral region. The N-type silicon layer 110a the is removed from the upper ends of the holes H up to the depth in the range of 100~500 Å. Next, P-type impurities are ion-implanted onto the N-type silicon layer 110a having an upper portion thereof removed to form a P-type silicon layer 110b on top of the N-type silicon layer 11a. Through this, vertical PN diodes 110 comprising a stack of the N-type silicon layer 110a and the P-type silicon layer 110b are formed as cell switching elements in the respective holes H to have a height which does not completely fill the hole H. The P-type silicon layer 110b is formed by ion-implanting B or BF$_2$ ions as P-type impurities at a doping concentration in the range of $1\times10^{20}$~$1\times10^{22}$ ions/cm$^3$.

Figure 2D:
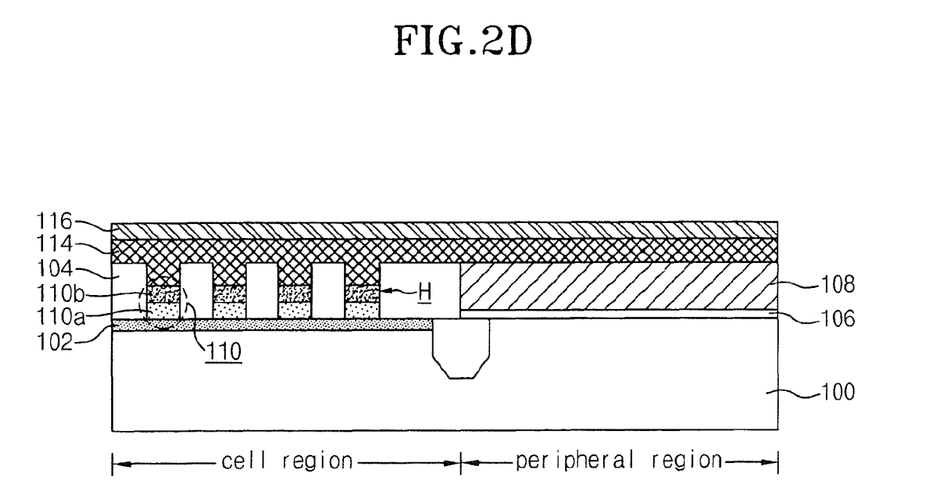

Referring to FIG. 2D, with the first etch mask 112 removed, a second gate conductive layer 114 and a hard mask layer 116 are sequentially formed on the entire surface of the silicon substrate 100 thereby completely filling the holes H in the cell regions in which the vertical PN diodes 110 are formed. The second gate conductive layer 114 is formed using any one of W, Cu, and Al. Since the vertical PN diodes 110 do not completely fill the holes H, portions of the second gate conductive layer 114 in the cell region have a thickness greater than the gate conductive layer 114 in the peripheral region.

The portions of the second gate conductive layer 114 in the cell region are used as the material for the subsequently formed heat sinks. Therefore, by increasing the deposition thickness of the second gate conductive layer 114, the height of the heat sinks can also be increased. Accordingly, an increased area capable of transferring heat in the heat sinks is obtained. Thus, when heat transfer from a phase change layer to heaters occurs, as the heat transfer area of the heat sinks is increased, the phase change layer can stably form the amorphous state, whereby the reset state having high resistance can be easily realized.

Figure 2E:
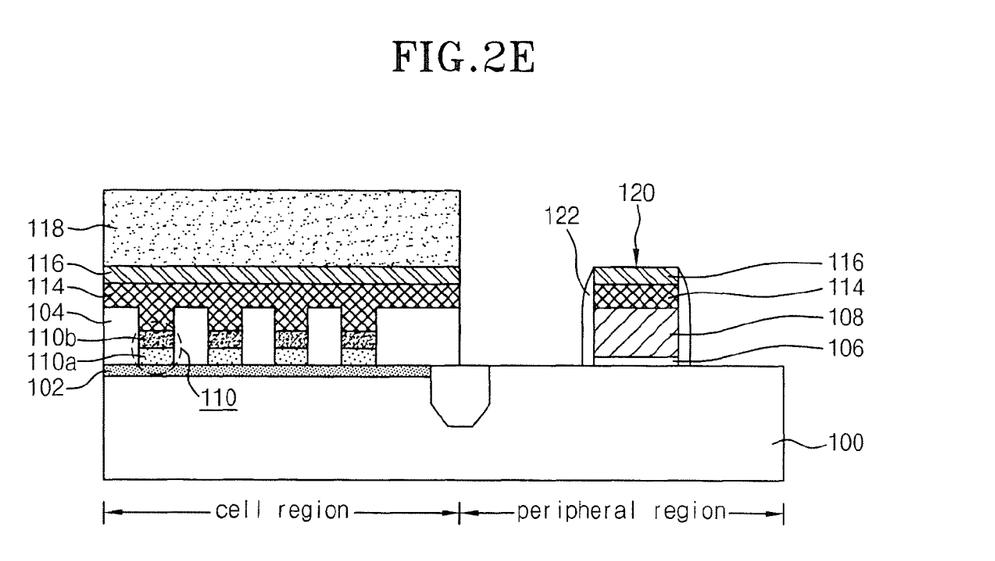

Referring to FIG. 2E, a second etch mask 118 comprising, for example, a photoresist pattern, is formed on the portion of the hard mask layer 116 in the cell region. A gate 120 is then formed by etching the hard mask layer 116, the second gate conductive layer 114, the first gate conductive layer 108, and the gate insulation layer 106 in the peripheral region such that a transistor can be formed as a driving circuit. Gate spacers 122 are formed on both sidewalls of the gate 120, and then junction areas (not shown) are formed in the silicon substrate 100 on both sides of the gate 120 including the gate spacers 122.

Figure 2F:
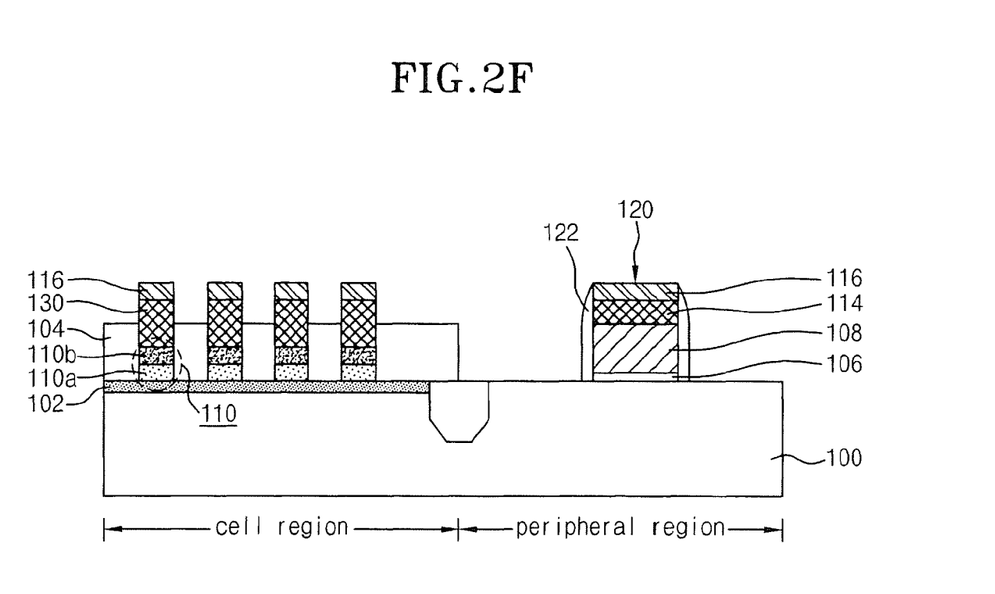

Referring to FIG. 2F, with the second etch mask 118 removed, the hard mask layer 116 and the second gate conductive layer 114 formed in the cell region are etched to form heat sinks 130 comprising the second gate conductive layer 114. The heat sinks 130 are formed coaxially on the vertical PN diodes 110.

Figure 2G:
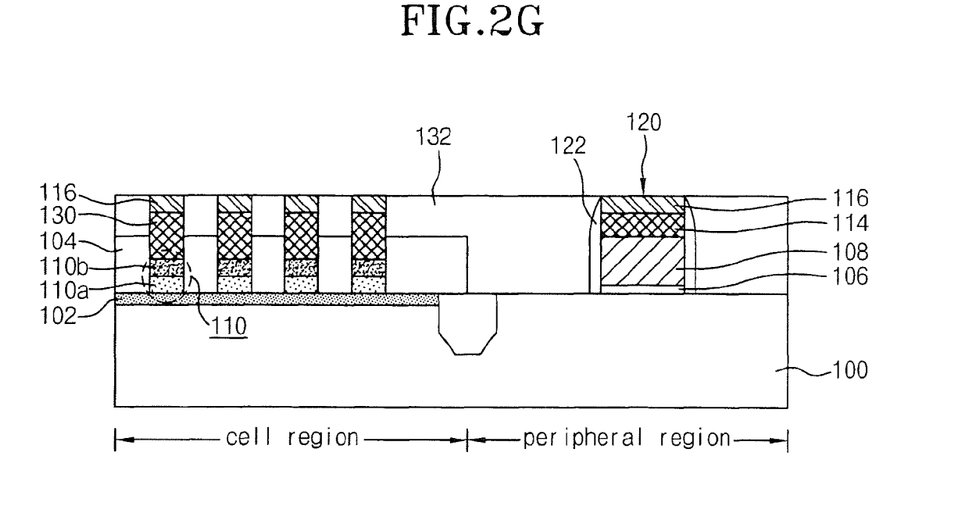

Referring to FIG. 2G, a second insulation layer 132 is deposited on the entire surface of the silicon substrate 100 to cover the hard mask 116 including the heat sinks 130 in the cell region and the gate 120 in the peripheral region. Then, the second insulation layer 132 is polished using a CMP process such that respective portions of the hard mask layer 116 in the cell region and the peripheral region are exposed.

Figure 2H:
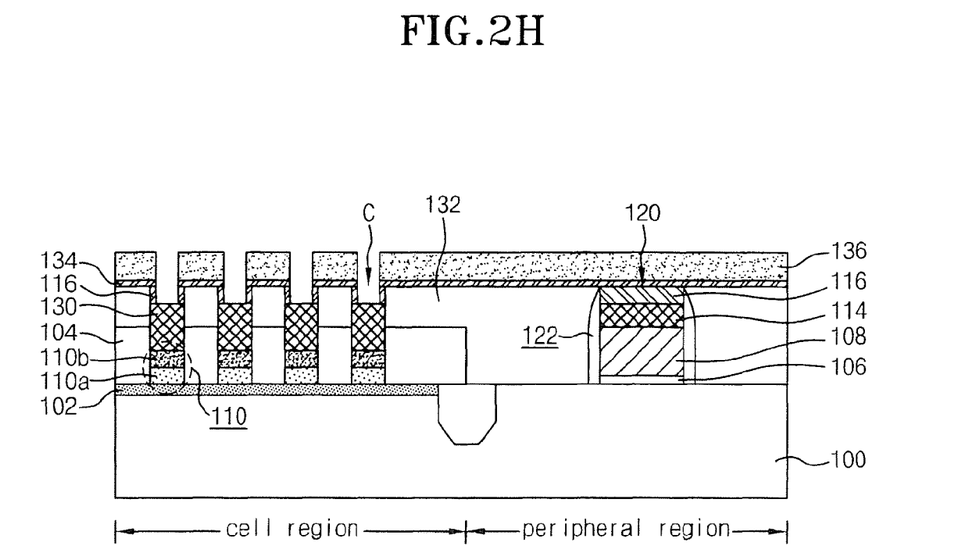

Referring to FIG. 2H, a passivation layer 134 comprising a nitride layer is formed on the second insulation layer 132 including the portions of the hard mask layer 116 exposed in the cell and peripheral regions. The passivation layer 134 is formed to prevent Joule heat transferred from the heaters to the phase change layer from being dissipated in the cell region, and to prevent the thickness of the hard mask layer 116 in the peripheral region from decreasing during in a subsequent CMP process.

A third etch mask 136 exposing the portions of the passivation layer 134 in the cell region which correspond to portions of the heat sinks 130 excluding both side portions of the heat sinks 130 is formed. The exposed portions of the passivation layer 134 and the portions of the hard mask layer 116 positioned thereunder are then etched to define contact holes C that expose portions of the heat sinks 130 excluding both side portions of the heat sinks 130.

Here, the contact holes C delimit the areas in which the heaters are to be formed. In the present invention, the formation of the heat sinks 130 allows for the height of the heaters (that is, the depth of the contact holes C) to be decreased. For example, the contact holes C can be defined to have a depth less than 100 nm, and preferably, a depth in the range of 20~80 nm. Accordingly, in the present invention, the depth of the contact holes C in which the heaters are to be formed can be decreased, and therefore, it is possible to prevent the size of the lower ends of the contact holes C from decreasing and the contact resistance of the heaters from increasing.

Figure 2I:
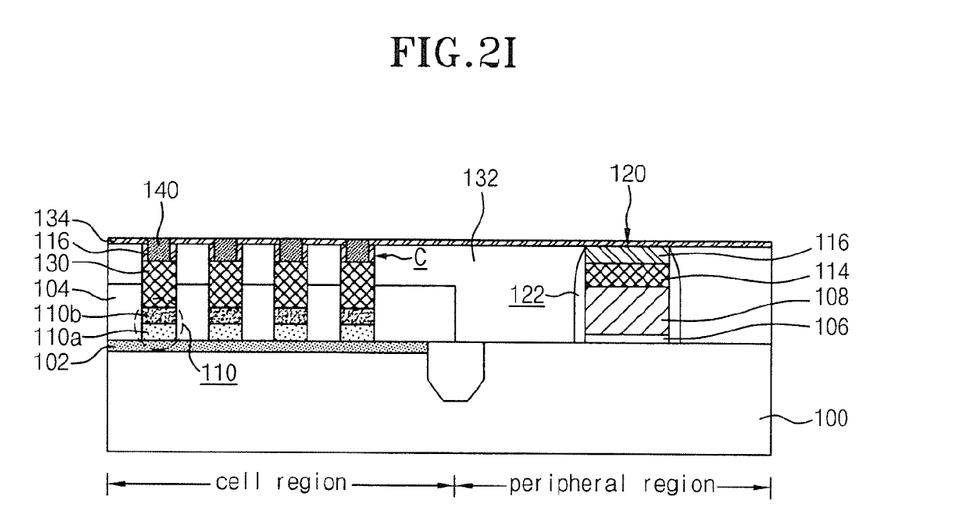

Referring to FIG. 2I, with the third etch mask 136 removed, a heater material is deposited on the remaining passivation layer 134 to fill the contact holes C. The heater material is then polished using a CMP process to expose the passivation layer 134, and thereby heaters 140 are formed in the contact holes C. The heater material comprises a material having high heat conductivity and low reactivity with the phase change layer, for example, any one of a TiW layer, a TiAlN layer, and a TiN layer.

Because the heat sinks 130 are formed under the heaters 140, the height of the heaters 140 can be decreased to be less than that of the conventional heaters, for example, to a height less than 100 nm, and preferably, a height in the range of 20~80 nm. Hence, the size of the lower end of the heaters 140 and the size of the upper end of the heaters 140 can be secured as desired.

Figure 2J:
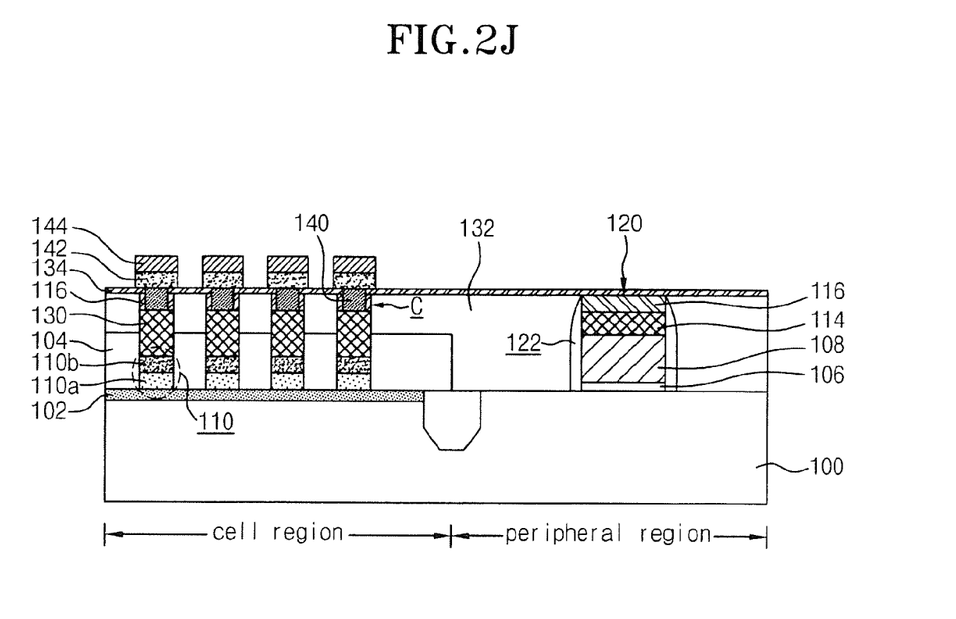

Referring to FIG. 2J, a phase change material layer and a conductive layer for top electrodes are sequentially deposited on the passivation layer 134 including the heaters 140. The phase change material and the conductive layer are then patterned to form stack patterns of a phase change layer 142 and a top electrode 144. The stack patterns of the phase change layer 142 and the top electrode 144 are formed in the shape of a line which extends in a direction perpendicular to the N+ base layer 102, so that the etch loss occurring on the edges of the phase change layer 142 can be minimized.

The phase change layer 142 is formed of a material containing at least one of Ge, Sb, and Te as a Chalcogenide material. Also, the phase change layer 142 is doped with at least one of oxygen, nitrogen, and silicon as impurities into the material. The top electrodes 144 are formed using any one of TiW, TiAlN, TiN, and WN.

Thereafter, while not shown in the drawings, a third insulation layer is formed to cover the stack patterns of the phase change layer 142 and the top electrode 144, and then bit lines are formed. The bit lines are to be connected to the top electrodes 144 by way of top electrode contacts. A fourth insulation layer is then formed to cover the bit lines, and a word line is formed on the fourth insulation layer. The word line is electrically connected to the N+ base layer 102. Thereupon, by sequentially conducting a series of subsequent processes, the manufacturing process of the phase change memory device according to the present embodiment is completed.

As is apparent from the above description, in the present embodiment, the heat sinks are formed under the heaters allowing the height of the heaters to be decreased. Accordingly, a heater forming process can be easily conducted, and it is possible to prevent the size of the lower ends of the heaters from decreasing. As a result, it is possible to prevent the contact resistance of the heaters from increasing and the current flow from the cell switching elements to the phase change layer can be stabilized.

Additionally, in the present invention, the heat transfer from the phase change layer to the areas of the heaters can quickly occur due to the formation of the heat sinks. As such, the amorphous phase of the phase change layer can be formed in a stable manner, and the reset state having high resistance can be easily realized.

Figure 3:
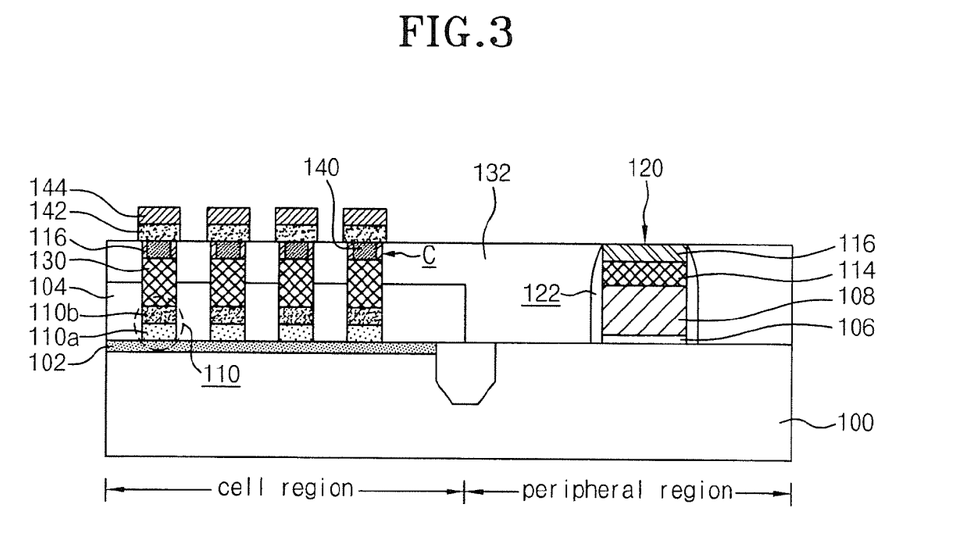
FIG. 3 is a cross-sectional view showing a phase change memory device according to another embodiment of the present invention.

In the aforementioned embodiment, the passivation layer is formed on the second insulation layer in order to prevent the thickness of the hard mask layer in the peripheral region from decreasing and the Joule heat which is transferred from the heaters to the phase change layer in the cell region from being dissipated. However, as shown in FIG. 3, the formation of the passivation layer may be omitted.

In this embodiment of the present invention, the other component parts including the heat sinks are the same as those of the aforementioned embodiment except that the passivation layer is not formed. Therefore, the same reference numerals are used in the drawing to refer to the same component parts, and a detailed description thereof will be omitted herein.

Even in the phase change memory device according to this embodiment of the present invention, the same effects including the decrease in the height of the heaters through the formation of the heat sinks can be accomplished.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A phase change memory device comprising:
    a silicon substrate having a cell region and a peripheral region;
    a first insulation layer formed in the cell region of the silicon substrate, wherein a hole is defined in the first insulation layer;
    a cell switching element formed within the hole, wherein the height of the cell switching element is less than the height of the first insulation layer;
    a heat sink formed within the hole and on the cell switching element, wherein a portion of the heat sink projects out of the hole in the first insulation layer;
    a gate formed in the peripheral region of the silicon substrate, the gate having a stack structure comprising a gate insulation layer, a first gate conductive layer, a second gate conductive layer, and a hard mask layer;
    a second insulation layer formed over the surface of the silicon substrate in the peripheral region and the cell region, wherein a contact hole is formed in the second insulation layer to expose the heat sink, and wherein the second insulation layer is formed such that the hard mask layer of the gate is exposed by the second insulation layer;
    a heater formed in the contact hole; and
    a stack pattern formed on the heater, the stacked pattern comprising a phase change layer and a top electrode.

2. The phase change memory device according to claim 1, further comprising:
    an N+ base layer formed in a surface of the silicon substrate in the cell region, wherein the cell switching element is formed on the N+ base layer.

3. The phase change memory device according to claim 1, wherein the height of the first insulation layer is greater than the height of the cell switching element by 100~500 Å.

4. The phase change memory device according to claim 1, wherein the cell switching element comprises a vertical PN diode in which an N-type silicon layer and a P-type silicon layer are stacked.

5. The phase change memory device according to claim 4, wherein the N-type silicon layer has a doping concentration in the range of $1 \times 10^{18} \sim 1 \times 10^{20}$ ions/cm$^3$.

6. The phase change memory device according to claim 4, wherein the P-type silicon layer has a doping concentration in the range of $1 \times 10^{20} \sim 1 \times 10^{22}$ ions/cm$^3$.

7. The phase change memory device according to claim 1, wherein the heat sink comprises any one of a W layer, a Cu layer, an Al layer, and a WSi layer.

8. The phase change memory device according to claim 1, wherein the first gate conductive layer comprises a polysilicon layer.

9. The phase change memory device according to claim 1, wherein the upper surface of the first gate conductive layer is coplanar to the upper surface of the first insulation layer.

10. The phase change memory device according to claim 1, wherein the second gate conductive layer comprises any one of a W layer, a Cu layer, an Al layer, and a WSi layer, and the heat sink comprises the same materials as the second gate conductive layer.

11. The phase change memory device according to claim 1, wherein the heater comprises any one of a TiW layer, a TiAlN layer, and a TiN layer.

12. The phase change memory device according to claim 1, wherein the heater has a height in the range of 20~80 nm.

13. The phase change memory device according to claim 1, further comprising:
    a hard mask layer formed between a sidewall of the hole and the heater.

14. The phase change memory device according to claim 13, wherein the hard mask layer formed between the sidewall of the hole and the heater comprises a layer that is coplanar to the hard mask layer of the gate.

15. The phase change memory device according to claim 13, wherein the hard mask layer comprises a nitride layer.

16. The phase change memory device according to claim 1, further comprising:
    a passivation layer formed on the second insulation layer.

17. The phase change memory device according to claim 16, wherein the passivation layer comprises a nitride layer.

18. The phase change memory device according to claim 1, wherein the phase change layer is formed of a material comprising at least one of Ge, Sb, and Te.

19. The phase change memory device according to claim 18, wherein the phase change layer is doped with at least one of oxygen, nitrogen, and silicon.

20. The phase change memory device according to claim 1, wherein the top electrodes comprise any one of TiW, TiAlN, TiN and WN.

21. A method for manufacturing a phase change memory device having a silicon substrate with a defined cell region and peripheral region, the method comprising the steps of:
   forming a first insulation layer having a plurality of holes in the cell region of the silicon substrate;
   forming a gate insulation layer on the semiconductor substrate in the peripheral region;
   forming a first gate conductive layer on the gate insulation layer in the peripheral region, wherein the upper surface of the first gate conductive layer is coplanar to the upper surface of the first insulation layer;
   forming cell switching elements each of which is formed in one of the respective holes, wherein an upper portion of each of the cell switching elements is recessed such that the height of the cell switching elements is less than the height of the first insulation layer;
   forming a second gate conductive layer on the first insulation layer and the first gate conductive layer, wherein the second gate conductive layer fills the holes;
   forming a hard mask layer on the second gate conductive layer;
   etching portions of the hard mask layer, the second gate conductive layer, the first gate conductive layer, and the gate insulation layer formed in the peripheral region to form a gate in the peripheral region;
   etching the hard mask layer and the second gate conductive layer in the cell region to form heat sinks each of which comprises the second gate conductive layer formed on a respective one of the cell switching elements, wherein each of the heat sinks projects out of the respective hole;
   forming a second insulation layer on the first insulation layer and on the silicon substrate in the peripheral region, wherein the second insulation layer is formed such that the hard mask layer on the heat sinks and the hard mask layer of the gate are exposed;
   etching the hard mask layer of the cell region to define contact holes each of which exposes a respective one of the heat sinks;
   forming a heater in each of the contact holes; and
   forming stack patterns comprising a phase change layer and a top electrode, wherein each of the stack patterns is formed on a respective one of the heaters and portions of the second insulation layer corresponding to the respective heater.

22. The method according to claim 21, wherein, before the step of forming the first insulation layer, the method further comprises the step of forming an N+ base layer in a surface of the silicon substrate in the cell region.

23. The method according to claim 21, wherein upper portion of each cell switching element is formed to be recessed to a depth in the range of 100~500 nm from upper ends of the holes.

24. The method according to claim 21, wherein each the cell switching elements are formed as vertical PN diodes.

25. The method according to claim 24, wherein the step of forming the cell switching elements comprises the steps of:
   forming an N-type silicon layer in each of the holes;
   recessing the N-type silicon layer; and
   ion-implanting P-type impurities onto the recessed N-type silicon layer to form a P-type silicon layer.

26. The method according to claim 25, wherein the step of forming the N-type silicon layer is implemented using a selective epitaxial growth process.

27. The method according to claim 25, wherein the N-type silicon layer is formed by ion-implanting P or As ions to have a doping concentration in the range of $1\times10^{18}$~$1\times10^{20}$ ions/cm$^3$.

28. The method according to claim 25, wherein the P-type silicon layer is formed by ion-implanting B or BF$_2$ ions to have a doping concentration in the range of $1\times10^{20}$~$1\times10^{22}$ ions/cm$^3$.

29. The method according to claim 21, wherein the first gate conductive layer comprises a polysilicon layer.

30. The method according to claim 21, wherein the second gate conductive layer and the heat sinks comprise at least one of a W layer, a Cu layer, an Al layer, and a WSi layer.

31. The method according to claim 21, wherein the hard mask layer comprises a nitride layer.

32. The method according to claim 21, wherein the contact holes are defined to have a depth in the range of 20~80 nm.

33. The method according to claim 21, wherein the heaters comprise any one of a TiW layer, a TiAlN layer, and a TiN layer.

34. The method according to claim 21, wherein the heaters are formed to have a height in the range of 20~80 nm.

35. The method according to claim 21, wherein, after the step of forming the heaters and before the step of forming the stack patterns, the method further comprises the step of:
   forming a passivation layer on the second insulation layer.

36. The method according to claim 35, wherein the passivation layer comprises a nitride layer.

37. The method according to claim 21, wherein the phase change layer is formed a material comprises at least one of Ge, Sb, and Te.

38. The method according to claim 37, wherein the phase change layer is doped with at least one of oxygen, nitrogen, and silicon.

39. The method according to claim 21, wherein the top electrodes are formed using any one of TiW, TiAlN, TiN, and WN.

* * * * *